(12) United States Patent
Ohashi et al.

(10) Patent No.: US 9,708,709 B2
(45) Date of Patent: Jul. 18, 2017

(54) SHADOW FRAME SUPPORT

(71) Applicant: Applied Materials, Inc., Santa Clara, CA (US)

(72) Inventors: Kengo Ohashi, Matsusaka (JP); Takao Hashimoto, Kobe (JP); Shinobu Abe, Osaka (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 467 days.

(21) Appl. No.: 14/037,719

(22) Filed: Sep. 26, 2013

(65) Prior Publication Data

US 2014/0109940 A1    Apr. 24, 2014

Related U.S. Application Data

(60) Provisional application No. 61/715,719, filed on Oct. 18, 2012.

(51) Int. Cl.
| | |
|---|---|
| *B08B 7/04* | (2006.01) |
| *B08B 9/00* | (2006.01) |
| *B08B 3/00* | (2006.01) |
| *C23C 16/44* | (2006.01) |
| *H01J 37/32* | (2006.01) |

(52) U.S. Cl.
CPC .... *C23C 16/4405* (2013.01); *H01J 37/32449* (2013.01); *H01J 37/32862* (2013.01)

(58) Field of Classification Search
None
See application file for complete search history.

(56) References Cited

U.S. PATENT DOCUMENTS

| | | |
|---|---|---|
| 5,352,294 A | 10/1994 | White et al. |
| 6,109,206 A | 8/2000 | Maydan et al. |
| 6,773,562 B1 | 8/2004 | Inagawa et al. |
| 2003/0029473 A1 | 2/2003 | Sun |
| 2005/0252529 A1 | 11/2005 | Ridgeway et al. |
| 2006/0090773 A1 | 5/2006 | Choi et al. |
| 2008/0286463 A1 | 11/2008 | Tiner et al. |
| 2009/0064934 A1 | 3/2009 | Park et al. |
| 2010/0037823 A1 | 2/2010 | Cho et al. |

OTHER PUBLICATIONS

PCT International Search Report and the Written Opinion dated Dec. 10, 2013 for International Application No. PCT/US2013/059937.

*Primary Examiner* — Eric Golightly
*Assistant Examiner* — Arlyn I Rivera-Cordero
(74) *Attorney, Agent, or Firm* — Patterson + Sheridan, LLP

(57) ABSTRACT

The present invention generally provides a processing chamber having shadow frame supports that direct cleaning gas flow to the corners of the chamber. The shadow frame supports are disposed along part of the chamber walls, thus leaving the corners unoccupied. During cleaning, the shadow frame is disposed in a way that it rests on both the substrate support and the shadow frame supports. Therefore, the cleaning gas flowing along the chamber walls is blocked by the shadow frame supports and the cleaning gas is forced to the corners since the shadow frame supports do not extend to the corners.

2 Claims, 5 Drawing Sheets

SHADOW FRAME SUPPORT

CROSS-REFERENCE TO RELATED APPLICATIONS

This application claims benefit of U.S. Provisional Patent Application Ser. No. 61/715,719, filed Oct. 18, 2012, which is herein incorporated by reference.

BACKGROUND OF THE INVENTION

Field of the Invention

Embodiments of the present invention generally relate to a processing chamber and cleaning methods.

Description of the Related Art

Substrate processing chambers provide a wide variety of functions. Often, when depositing dielectric layers on the substrate, the residue from the deposition process collects on the walls and other surfaces of the processing chambers. These deposits may become friable and contaminate the surface of the substrate. Because the chambers are usually part of an integrated tool to rapidly process substrates, it is essential that maintenance and cleaning of the chambers require minimum time. To reduce the likelihood of contamination and thus improve the throughput of the chambers, effective and timely cleaning the surfaces of the chambers is desirable.

Currently, the mechanism for removing silicon or carbon containing deposits from the surfaces of the chamber include remote plasma clean, in situ RF plasma clean, or RF-assisted remote plasma clean. Remote plasma with fluorine containing gas may be used for cleaning the chamber surfaces. For example, a cleaning gas $NF_3$ may be remotely ignited into a plasma and the radicals from the plasma are introduced into the chamber to etch away film deposited on the chamber surfaces.

However, the cleaning rate of the chamber surfaces is not uniform due to the way the radicals flows inside the chamber. Therefore, an improved apparatus and cleaning method is needed to enhance the cleaning rate of processing chambers.

SUMMARY OF THE INVENTION

The present invention generally provides a processing chamber having shadow frame supports that direct cleaning gas flow to the corners of the chamber. The shadow frame supports are disposed along part of the chamber walls, thus leaving the corners unoccupied. During cleaning, the shadow frame is disposed in a way that it rests on both the substrate support and the shadow frame supports. Therefore, the cleaning gas flowing along the chamber walls is blocked by the shadow frame supports and the cleaning gas is forced to the corners since the shadow frame supports do not extend to the corners.

In one embodiment, a processing apparatus is disclosed. The processing apparatus comprises a chamber body having an interior defined by a plurality of walls, at least one wall having an opening therethrough, a first shadow frame support extending from a first wall of the plurality of walls and having a first length that is less than the length of the first wall, a second shadow frame support extending from a second wall of the plurality of walls and having a second length that is less than the length of the second wall, a third shadow frame support extending from a third wall of the plurality of walls and having a third length that is less than the length of the third wall, and a fourth shadow frame support extending from a fourth wall of the plurality of walls and having a fourth length that is less than the length of the fourth wall.

In another embodiment, a processing apparatus is disclosed. The processing apparatus comprises a chamber body having an interior defined by a plurality of walls, a first wall of the plurality of walls having a first length, the plurality of walls forming a plurality of corners. The processing apparatus also includes a plurality of shadow frame supports comprising a first shadow frame support having a second length and the first shadow frame support is attached to the first wall along the first length of the wall. The second length is less than the first length and the first shadow frame support is positioned in a manner along the length of the first wall such that the first shadow frame support is not in contact with a corner.

In another embodiment, a cleaning method is disclosed. The cleaning method comprises disposing a shadow frame on top of shadow frame supports within the processing chamber, raising a substrate support to a position so that the shadow frame touches both the substrate support and the shadow frame supports, and flowing a cleaning gas within the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides a processing chamber having shadow frame supports that direct cleaning gas flow to the corners of the chamber. The shadow frame supports are disposed along part of the chamber walls, thus leaving the corners unoccupied. During cleaning, the shadow frame is disposed in a way that it rests on both the substrate support and the shadow frame supports. Therefore, the cleaning gas flowing along the chamber walls is blocked by the shadow frame supports and the cleaning gas is forced to the corners since the shadow frame supports do not extend to the corners.

The invention is illustratively described below utilized in a processing system, such as a plasma enhanced chemical vapor deposition (PECVD) system available from AKT America, a division of Applied Materials, Inc., Santa Clara, Calif. However, it should be understood that the invention has utility in other system configurations, including those sold by other manufacturers.

Figure 1:
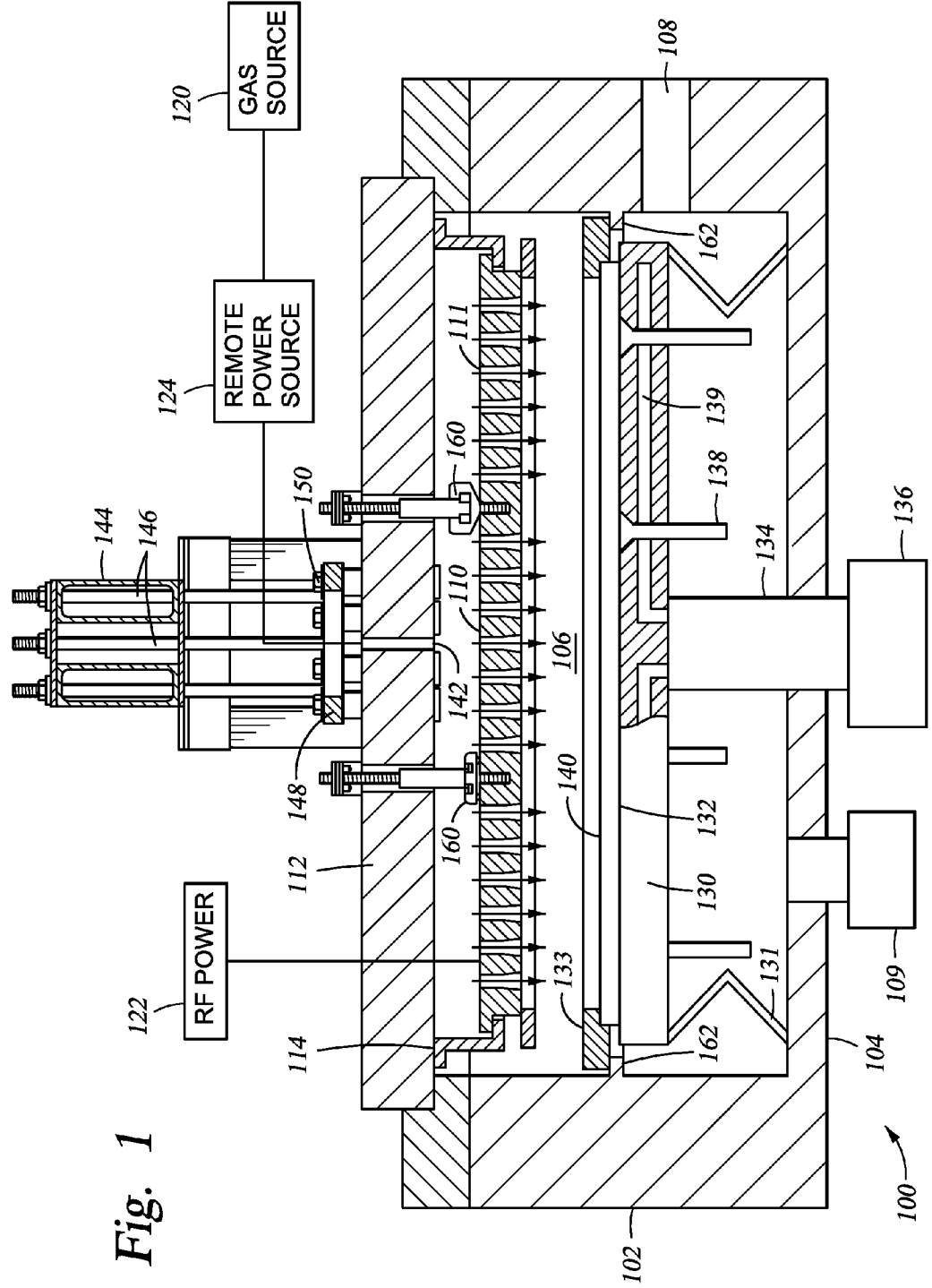
FIG. 1 is a cross sectional view of a processing chamber having shadow frame supports according to one embodiment of the invention.

FIG. 1 is a cross sectional view of PECVD apparatus according to one embodiment of the invention. The apparatus includes a chamber 100 in which one or more films may be deposited onto a substrate 140. As shown in FIG. 1, the substrate is in a lowered position where processing may not occur. The apparatus may be used to process one or more substrates including semiconductor substrates, flat panel display substrates, and solar panel substrates.

The chamber 100 generally includes walls 102, a bottom 104, a showerhead 110, and substrate support or susceptor 130 which define a process volume 106. The process volume 106 is accessed through an opening 108 such that the substrate 140 may be transferred in and out of the chamber 100. The substrate support 130 includes a substrate receiving surface 132 for supporting a substrate 140. One or more stems 134 may be coupled to a lift system 136 to raise and lower the substrate support 130. Lift pins 138 are moveably disposed through the substrate support 130 to move a substrate 140 to and from the substrate receiving surface 132. The substrate support 130 may also include heating and/or cooling elements 139 to maintain the substrate support 130 at a desired temperature. The substrate support 130 may also include grounding straps 131 to provide RF grounding at the periphery of the substrate support 130. The spacing between the top surface of the substrate 140 disposed on the substrate receiving surface 132 and the showerhead 110 may be between about 400 mil and about 1,200 mil. In one embodiment, the spacing may be between about 400 mil and about 800 mil.

The showerhead 110 may be coupled to a backing plate 112 at its periphery by a suspension 114. The showerhead 110 may also be coupled to the backing plate 112 by one or more coupling supports 160 to help prevent sag and/or control the straightness/curvature of the showerhead 110. In one embodiment, twelve coupling supports 160 may be used to couple the showerhead 110 to the backing plate 112. The coupling supports 160 may include a fastening mechanism such as a nut and bolt assembly. Additionally and/or alternatively, a center coupling mechanism may be present to couple the backing plate 112 to the showerhead 110. The center coupling mechanism may surround the ring 148 (discussed below) and be suspended from a bridge assembly. In still another embodiment, the coupling supports 160 may comprise a fastener threaded into the showerhead 110. The fastener may have a slotted opening for receiving a rod that is coupled to the backing plate 112. The rod may be coupled to the backing plate 112 with a vacuum seal.

A gas source 120 may be coupled to the backing plate 112 to provide gas through a gas outlet 142 in the backing plate 112 and through gas passages 111 in the showerhead 110 to the substrate receiving surface 132. A vacuum pump 109 may be coupled to the chamber 100 to control the process volume 106 at a desired pressure. An RF power source 122 is coupled to the backing plate 112 and/or to the showerhead 110 to provide an RF power to the showerhead 110. The RF power creates an electric field between the showerhead 110 and the substrate support 130 so that a plasma may be generated from the gases between the showerhead 110 and the substrate support 130. Various frequencies may be used, such as a frequency between about 0.3 MHz and about 200 MHz. In one embodiment, the RF power source is provided at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 so that a remote plasma is generated and provided to clean chamber components. The cleaning gas may be further excited by the RF power source 122 provided to the showerhead. Suitable cleaning gases include but are not limited to $NF_3$, $F_2$, and $SF_6$.

The backing plate 112 may be supported by a bridge assembly 144. One or more anchor bolts 146 may extend down from the bridge assembly 144 to a support ring 148. The support ring 148 may be coupled with the backing plate 112 by one or more bolts 150. The support ring 148 may be coupled with the backing plate 112 substantially in the center of the backing plate 112. The center of the backing plate 112 is the area of the backing plate 112 with the least amount of support in absence of the support ring 148. Therefore, supporting the center area of the backing plate 112 may reduce and/or prevent sagging of the backing plate.

A shadow frame 133 may be placed over the periphery of the substrate 140. The shadow frame 133 may rest on a shadow frame support 162 when the substrate support 130 is lowered. In one embodiment, the shadow frame support 162 may comprise the same material as the chamber. In another embodiment, the shadow frame support 162 may comprise a dielectric material. In another embodiment, the shadow frame support 162 may comprise stainless steel. In another embodiment, the shadow frame support 162 may comprise aluminum. The shadow frame 133 may reduce deposition at the edge of the substrate 140 and on areas of the substrate support 130 that are not covered by the substrate 140. When the substrate 140 is initially inserted into the chamber, the shadow frame 133 may rest on the shadow frame support 162. When the substrate support 130 raises to the processing position the shadow frame 133 may be raised by the substrate 140 and substrate support 130 off of the shadow frame support 162.

During the cleaning process, the shadow frame 133 may rest on the shadow frame support 162, and the substrate receiving surface 132 is raised to a level that it touches the shadow frame 133 without lifting the shadow frame 133 off of the shadow frame support 162.

Figure 2:
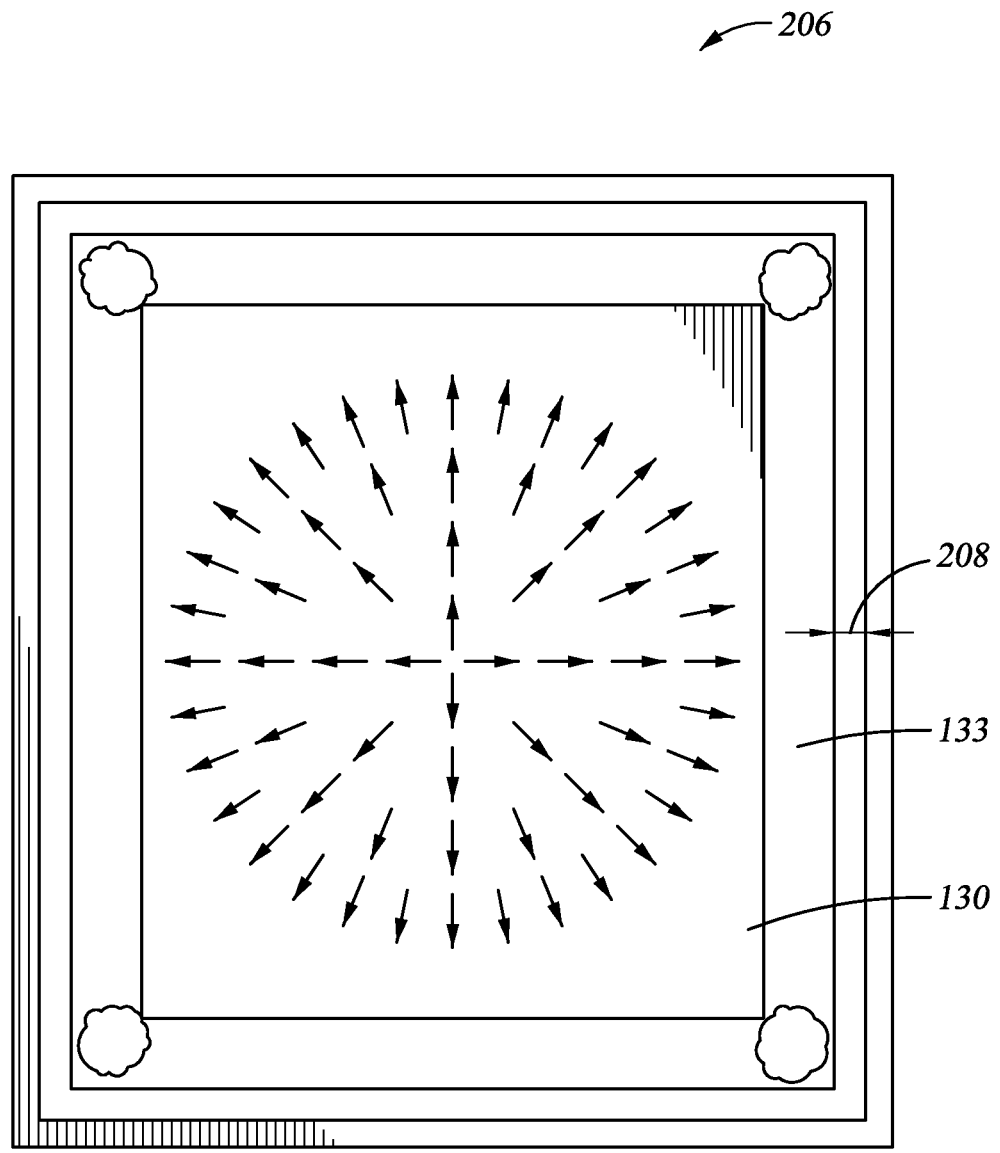
FIG. 2 is a top view of a processing chamber according to one embodiment having a substrate support and a shadow frame.

FIG. 2 is a top view of a substrate support and a shadow frame inside of a chamber. The shadow frame 133 is disposed on top of a substrate support 130. A pumping gap 208 is formed between the shadow frame 133 and the chamber body 206 for cleaning gas to pass through. Cleaning gas may be $NF_3$, $SF_6$, $C_2F_6$, HCl or combination thereof. In one embodiment, a cleaning gas $NF_3$ is remotely ignited into a plasma and the radicals from the plasma are introduced into the chamber to etch away film deposited on surfaces of the substrate support 130, the shadow frame 133, and the chamber walls. The vacuum pump 109 draws the radicals towards the bottom of the chamber 100. The radicals reach the substrate support 130 and are directed towards the chamber walls because the radicals cannot pass through the solid substrate support 130. The vacuum pump draws the radicals through the pumping gap 208 to the area below the substrate support 130. The radicals flow in the directions indicated by the arrows in FIG. 2. The amount of radicals flowing to the corners of the chamber is less than the amount of radicals flowing to the sides, thus the corners of the shadow frame 133 and the chamber 100 may not be completely cleaned even though other surfaces are clean.

Figure 3:
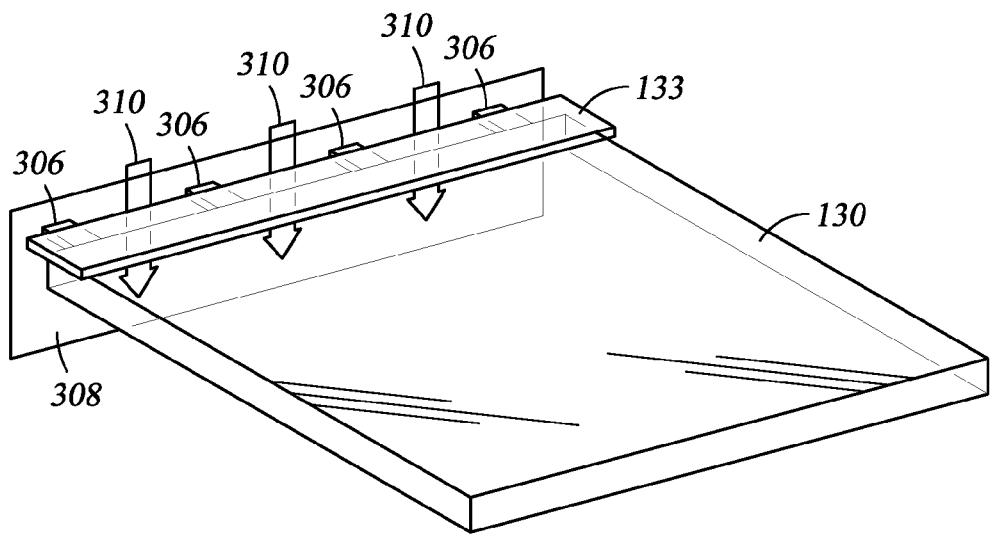
FIG. 3 is a perspective view of a shadow frame support, shadow frame and substrate support.

FIG. 3 is a perspective view of a shadow frame support 306 having a shadow frame 133 disposed thereon. During cleaning, the shadow frame 133 rests on both the substrate support 130 and a shadow frame support 306. The shadow frame support 306 comprises a plurality of blocks extending from the chamber wall 308, and each block is spaced apart from the next block. Pumping gaps 310 are therefore present between adjacent blocks when the shadow frame 133 is disposed on the shadow frame support 306 and substrate support 130. Thus more cleaning gas radicals flow to the sides than to the corners.

Figure 4:
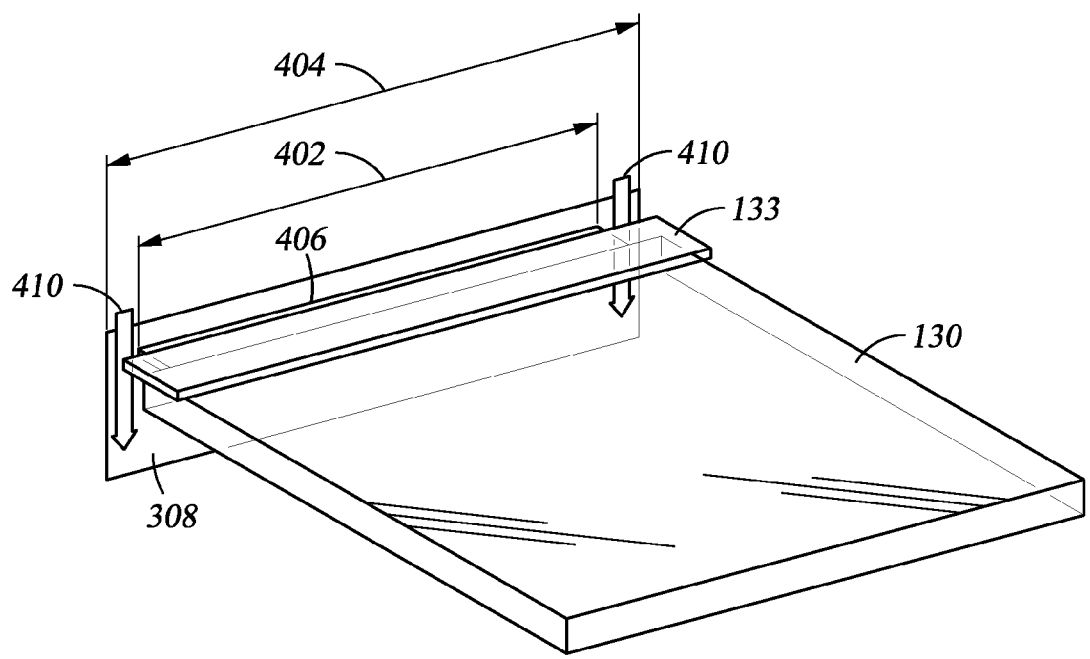
FIG. 4 is a perspective view of a shadow frame support, shadow frame and substrate support according to one embodiment of the invention.

FIG. 4 is a perspective view of a shadow frame support 406 according to one embodiment of the invention. In one embodiment, a shadow frame support 406 comprises a single block extending from the chamber wall 308. The shadow frame support 406 may be made with a dielectric material, stainless steel, or aluminum and having a length 402 that is less than a length 404 of the chamber wall 308. The shadow frame support 406 is positioned so that there are pumping gaps 410 between both ends of the shadow frame support 406 and the walls adjacent to the chamber wall 308. In one embodiment, the shadow frame support 406 is positioned in the center of the chamber wall 308, so the pumping gaps 410 have the same length along the chamber wall 308. Thus the cleaning gas radicals are drawn through the pumping gaps 410 to the vacuum pump disposed below the substrate support 130. The radicals are directed evenly to the corners of the chamber, therefore improving the cleaning rate of the corners of the shadow frame 133.

Figure 5:
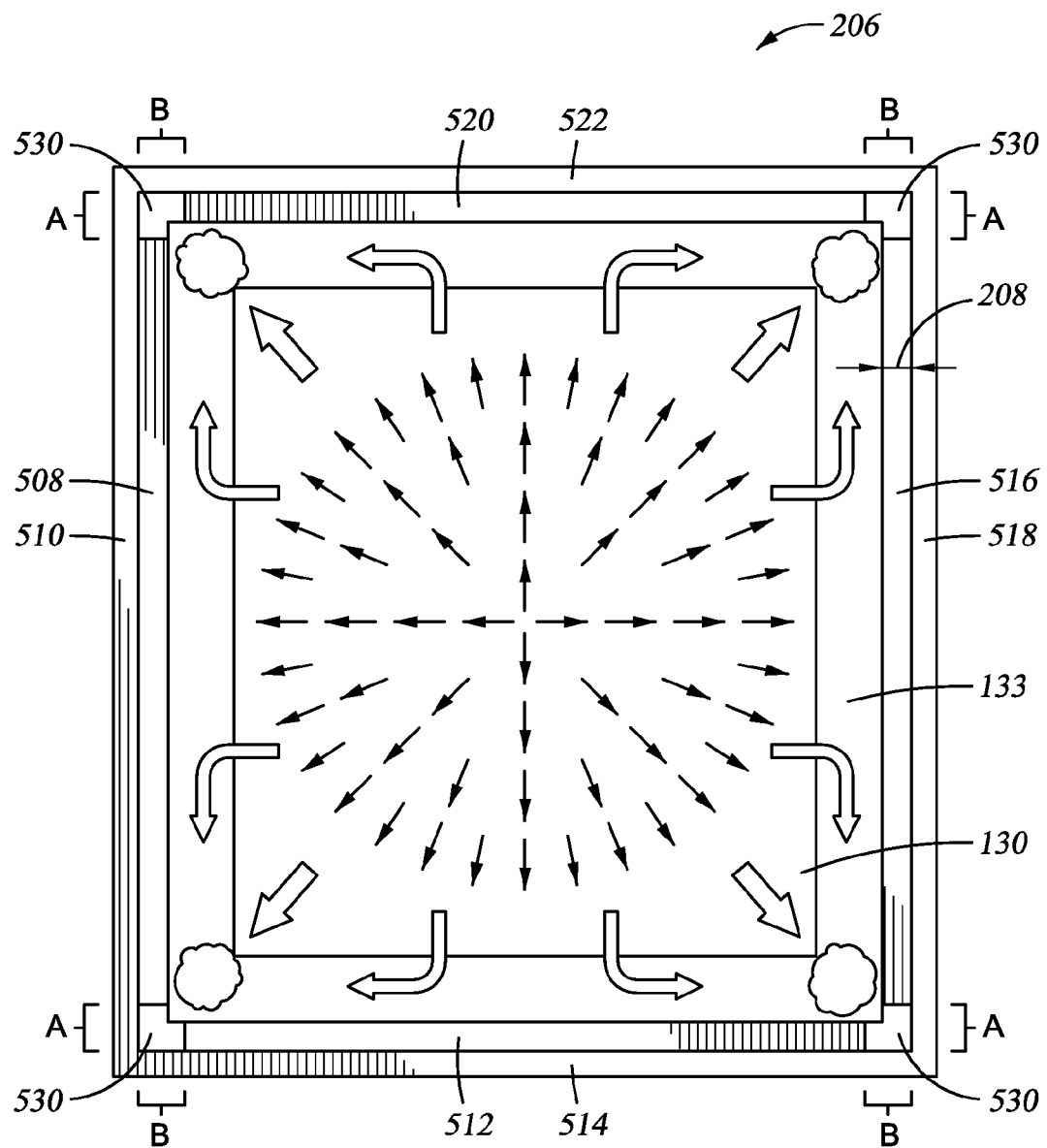
FIG. 5 is a top view of a processing chamber having a substrate support and a shadow frame with shadow frame supports according to one embodiment of the invention.

FIG. 5 is a top view of a substrate support and shadow frame with the shadow frame supports according to one embodiment of the invention. As shown in FIG. 5, a chamber body 206 has an interior defined by a plurality of walls. In one embodiment, a first shadow frame support 508 extends from a first wall 510 of the plurality of walls and having a first length that is less than the length of the first wall. In some embodiments, the first shadow frame support 508 is positioned so that there are gaps between ends of the first shadow frame support 508 and the walls adjacent to the first wall 510.

A second shadow frame support 512 extends from a second wall 514 of the plurality of walls and having a second length that is less than the length of the second wall 514. In some embodiments, the second shadow frame support 512 is positioned so that there are gaps between ends of the second shadow frame support 512 and the walls adjacent to the second wall 514.

A third shadow frame support 516 extends from a third wall 518 of the plurality of walls and having a third length that is less than the length of the third wall 518. In some embodiments, the third shadow frame support 516 is positioned so that there are gaps between ends of the third shadow frame support 516 and the walls adjacent to the third wall 518.

A fourth shadow frame support 520 extends from a fourth wall 522 of the plurality of walls and having a fourth length that is less than the length of the fourth wall 522. In some embodiments, the forth shadow frame support 520 is positioned so that there are gaps between ends of the four shadow frame support 520 and the walls adjacent to the fourth wall 522.

Based on the configuration of FIG. 5, the only gaps 530 present through which the cleaning gas radicals may flow to the area beneath the substrate support 130 is at the corners of the processing chamber. Because the shadow frame 133 is disposed on both the substrate support 130 and the shadow frame supports 508, 512, 516, and 520, all radicals must pass through the gaps 530. Thus, pumping gaps 530 are located at the corners of the processing chamber and force the cleaning gas radicals to flow along the chamber walls to the corner of the chamber so that the corners of the chamber will be cleaned effectively.

In one embodiment, the shadow frame support 508 is positioned in the center of the chamber wall 510, leaving a gap with a length "A" on both ends of the shadow frame support 508. The shadow frame support 512 is also positioned in the center of the chamber wall 514, thus leaving a gap with a length "B" on both ends of the shadow frame support 512. In one embodiment, chamber walls 510 and 518 have the same length and shadow frame supports 508 and 516 have the same length. Chamber walls 514 and 522 have the same length and shadow frame supports 512 and 520 have the same length. As the result, four pumping gaps 530 have the same area. As the arrows in FIG. 5 indicate, the cleaning gas radicals flow is directed evenly to the pumping gaps 530, thus improving the cleaning rate of the film deposited on the corners of the shadow frame 133.

Figure 6A:
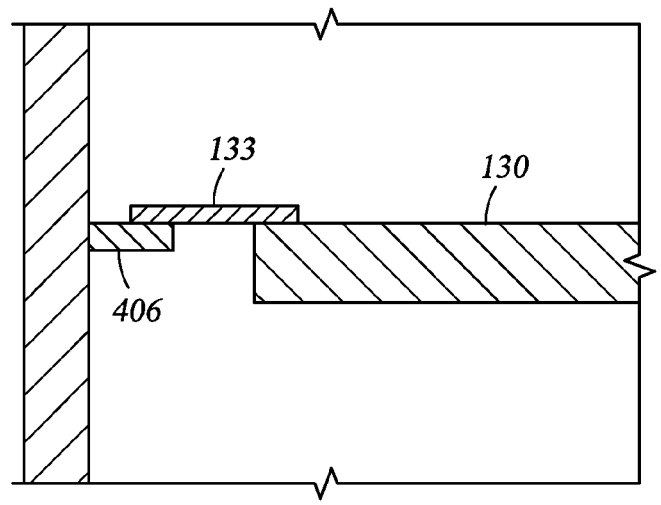
FIG. 6A is a schematic side view of the substrate support in the cleaning position according to one embodiment of the invention.

FIG. 6A is a schematic side view of the substrate support 130 in the cleaning position according to one embodiment of the invention. In order for the cleaning gas to flow to the corners of the processing chamber, the shadow frame 133 may block the gap between the substrate support 130 and the shadow frame support 406. During cleaning, the shadow frame 133 is disposed on top of the shadow frame support 406. The substrate support 130 is shown in the cleaning position so that the shadow frame 133 touches both the substrate support 130 and the shadow frame support 406. Cleaning gas radicals are introduced into the processing chamber. In one embodiment, the cleaning gas comprises $NF_3$. The shadow frame 133 blocks the gap between the substrate support 130 and the shadow frame support 406, forcing the radicals to the corners of the processing chamber. In one embodiment, a processing chamber has four walls having four shadow frame supports 406 extending from the four walls. The shadow frame supports 406 block the cleaning gas from flowing along a length of the walls and direct the cleaning gas flow to the four corners.

Figure 6B:
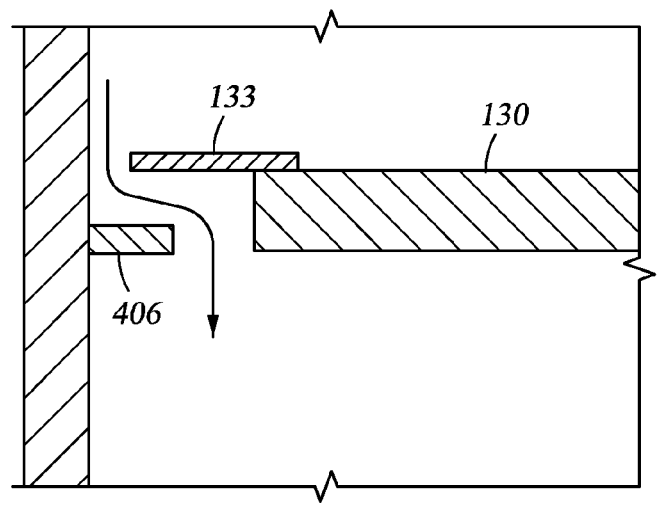
FIG. 6B is a schematic side view of the substrate support in processing position according to one embodiment of the invention.

FIG. 6B is a schematic side view of the substrate support 130 in the processing position according to one embodiment of the invention. During substrate processing, the substrate support 130 having a substrate (not shown in the figure) disposed thereon, is raised to a position such that the shadow frame 133 is spaced from the shadow frame support 406. The shadow frame 133 is lifted by the substrate support 130, thus a processing gas may flow through a gap formed between the substrate support 130 and the shadow frame support 406 via the gap between the shadow frame 133 and the chamber wall. Therefore the processing gas is not forced to the corners of the processing chamber.

Figure 6C:
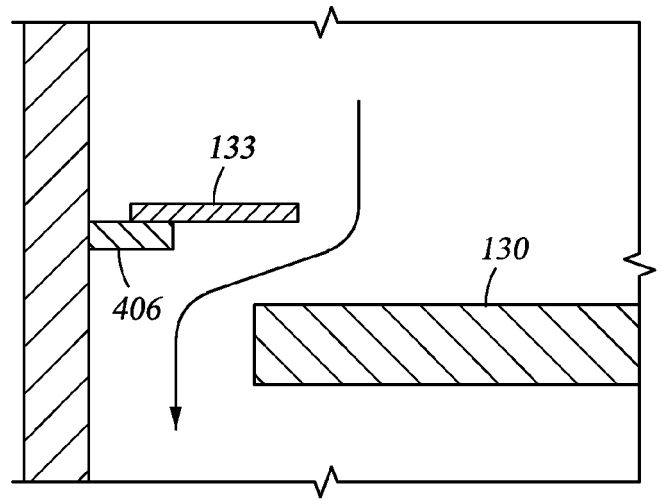
FIG. 6C is a schematic side view of the substrate support in a lowered position according to one embodiment of the invention.

FIG. 6C is a schematic side view of the substrate support 130 in a lowered position for substrate insertion and removal according to one embodiment of the invention. The substrate support 130 is lowered to a position that is below the shadow frame support 406 such that the shadow frame 133 rests on the shadow frame support 406, thus creating a gap between the shadow frame 133 and the substrate support 130. The gap allows gases to flow through along the length of the chamber wall. In this configuration, the gas, regardless whether cleaning or processing, is not forced to the corners of the processing chamber.

The table below shows the effect on cleaning times with the shadow frame support according to one embodiment. In one embodiment, SiN film was deposited on several substrates followed by cleaning process, during which the etching endpoint was monitored at the corners of the shadow frame. Etching time was compared between conventional shadow frame support and the shadow frame support according to one of the embodiments of the invention. Cleaning times at four areas of the chamber, SN (first side), SN (second side), Win (first side) and Win (second side) were recorded. A total cleaning time was reduced from 547 seconds for the conventional shadow frame support to 315 seconds for the shadow frame support according to one embodiment, representing a reduction of 42%.

TABLE

|  | Multi-piece Shadow Frame Support | Shadow Frame Support According to One Embodiment |
|---|---|---|
| Total Etch Time | 547 sec | 315 sec |
| S/V (first side) | 423 sec | 253 sec |
| S/V (second side) | 423 sec | 247 sec |
| Win (first side) | 500 sec | 306 sec |
| Win (second side) | 547 sec | 315 sec |

When the cleaning time is reduced, the amount of cleaning gas needed is also reduced. As a result, production cost is also minimized, which leads to lowered substrate cost. In one embodiment, the substrate is a liquid crystal display (LCD) panel.

In summary, chamber cleaning time can be minimized by directing cleaning gas to the corners of the processing chamber. An improved shadow frame support is used to block the pumping gaps between the substrate support and the shadow frame along the chamber walls, only leaving the corners open. During cleaning, the substrate support is raised to a position that the shadow frame touches both the shadow frame support and the substrate support.

While the foregoing is directed to embodiments of the present invention, other and further embodiments of the invention may be devised without departing from the basic scope thereof, and the scope thereof is determined by the claims that follow.

The invention claimed is:

1. A cleaning method, comprising:
    disposing a shadow frame on top of shadow frame supports within a processing chamber, wherein the processing chamber includes a plurality of walls and a plurality of corners formed by the plurality of walls;
    raising a substrate support to a position so that the shadow frame touches both the substrate support and the shadow frame supports; and
    flowing a cleaning gas within the processing chamber, wherein the shadow frame supports block the cleaning gas from flowing along a length of the walls and direct the cleaning gas flow only to the plurality of corners of the processing chamber.

2. The method of claim 1, wherein the cleaning gas is $NF_3$.

* * * * *